United States Patent
Lee et al.

(10) Patent No.: US 9,866,182 B2
(45) Date of Patent: Jan. 9, 2018

(54) MRAM-BASED PRE-DISTORTION LINEARIZATION AND AMPLIFICATION CIRCUITS

(71) Applicant: Crocus Technology Inc., Santa Clara, CA (US)

(72) Inventors: Douglas J. Lee, San Jose, CA (US); Yaron Oren-Pines, San Jose, CA (US); Seyed A. Tabatabaei, Mountain View, CA (US)

(73) Assignee: Crocus Technology Inc., Santa Clara, CA (US)

( * ) Notice: Subject to any disclaimer, the term of this patent is extended or adjusted under 35 U.S.C. 154(b) by 0 days.

(21) Appl. No.: 15/154,776

(22) Filed: May 13, 2016

(65) Prior Publication Data

US 2016/0336906 A1  Nov. 17, 2016

Related U.S. Application Data

(60) Provisional application No. 62/162,613, filed on May 15, 2015.

(51) Int. Cl.
| H03F 1/32 | (2006.01) |
| H03F 1/02 | (2006.01) |
| H03F 15/00 | (2006.01) |
| H04B 1/04 | (2006.01) |
| G11C 11/16 | (2006.01) |
| H03F 3/195 | (2006.01) |

(52) U.S. Cl.
CPC .......... *H03F 1/3247* (2013.01); *G11C 11/161* (2013.01); *G11C 11/1673* (2013.01); *G11C 11/1675* (2013.01); *H03F 1/0233* (2013.01); *H03F 3/195* (2013.01); *H03F 15/00* (2013.01); *H04B 1/04* (2013.01); *G11C 11/16* (2013.01); *H03F 2200/102* (2013.01); *H03F 2201/3227* (2013.01); *H04B 2001/045* (2013.01); *H04B 2001/0425* (2013.01); *H04B 2001/0433* (2013.01)

(58) Field of Classification Search
CPC ..................................................... H03F 1/3241
USPC .......................................... 330/149; 375/297
See application file for complete search history.

(56) References Cited

U.S. PATENT DOCUMENTS

| 6,600,369 B2 * | 7/2003 | Mitzlaff ................ H03F 1/0222 330/10 |
| 7,463,697 B2 | 12/2008 | Maltsev et al. |
| 7,518,445 B2 * | 4/2009 | Woo ........................ H03C 5/00 330/10 |

(Continued)

FOREIGN PATENT DOCUMENTS

WO   2014/048758 A1   4/2014

OTHER PUBLICATIONS

Copenheaver, Blaine R., International Search Report and Written Opinion issued to international patent application No. PCT/US2016/032510, dated Aug. 12, 2016, 9 pgs.

*Primary Examiner* — Henry Choe
(74) *Attorney, Agent, or Firm* — Cooley LLP

(57) ABSTRACT

A circuit has a magnetic device to produce a pre-distorted signal from a sinusoidal input signal. The magnetic device has physical attributes selected to produce characteristics of the pre-distorted signal. A power amplifier is coupled to the magnetic device. The power amplifier processes the pre-distorted signal to produce an output signal with reduced nonlinear behavior associated with the power amplifier.

10 Claims, 17 Drawing Sheets

(56) References Cited

U.S. PATENT DOCUMENTS

| | | | |
|---|---|---|---|
| 7,646,239 B2* | 1/2010 | Iwasaki | H03F 1/3223 330/151 |
| 7,680,467 B2* | 3/2010 | Ishigami | H03F 1/3223 330/136 |
| 7,772,925 B2* | 8/2010 | Bouny | H03F 1/3276 330/124 R |
| 7,847,631 B2* | 12/2010 | Jiang | H03F 1/3247 330/149 |
| 8,718,582 B2 | 5/2014 | See et al. | |
| 8,766,718 B2 | 7/2014 | Matsumoto et al. | |
| 8,934,854 B2* | 1/2015 | McCallister | H03F 1/3247 375/297 |
| 8,964,821 B2 | 2/2015 | Coan et al. | |
| 9,041,464 B2* | 5/2015 | Komninakis | H03F 1/0244 330/127 |
| 9,077,936 B2* | 7/2015 | Zhou | H04N 5/44 |
| 9,197,168 B2* | 11/2015 | Al-Qaq | H03F 1/3241 |
| 9,337,781 B2* | 5/2016 | Hammi | H03F 3/189 |
| 9,385,929 B2* | 7/2016 | Barrass | H04L 43/08 |
| 9,608,691 B2* | 3/2017 | Schemmann | H04B 3/10 |
| 2007/0241812 A1 | 10/2007 | Yang et al. | |
| 2007/0290748 A1 | 12/2007 | Woo et al. | |
| 2011/0095820 A1* | 4/2011 | Hou | H03F 1/3247 330/149 |
| 2012/0154039 A1* | 6/2012 | Brice | H03F 1/3247 330/149 |
| 2012/0242405 A1 | 9/2012 | Chung et al. | |
| 2012/0286864 A1* | 11/2012 | Vella-Coleiro | H03F 1/3247 330/149 |
| 2013/0257529 A1* | 10/2013 | Komninakis | H03F 1/0244 330/149 |

* cited by examiner

Typical PA Response $$X(t) = A\cos(\omega_c t) = \frac{1}{2}(e^{j w_c t} + e^{-j w_c t})$$

$$Z(t) = a_1 X(t) + a_2 X^2(t) + a_3 X^3(t)$$

$$Z(t) = \frac{1}{2}a_2 A^2 + \left(a_1 A + \frac{3}{4}a_3 A^3\right)\cos(\omega_c t) + \frac{1}{2}a_2 A^2 \cos(2\omega_c t) + \frac{1}{4}a_3 A^3 \cos(3\omega_c t)$$

FIG. 5

- $a_1=0.6$, $a_2=0$, $a_3=0.3$ for linearizer
- $a_1=1$, $a_2=0$, $a_3=0$ for No linearizer
- $b_1=10$, $b_2=0$, $b_3=-7$ for PA $X(t) = A \cos(\omega_c t)$ $y(t) = a_1 x(t) + a_2 x^2(t) + a_3 x^3(t)$ $z(t) = b_1 y(t) + b_2 y^2(t) + b_3 y^3(t)$

FIG. 6

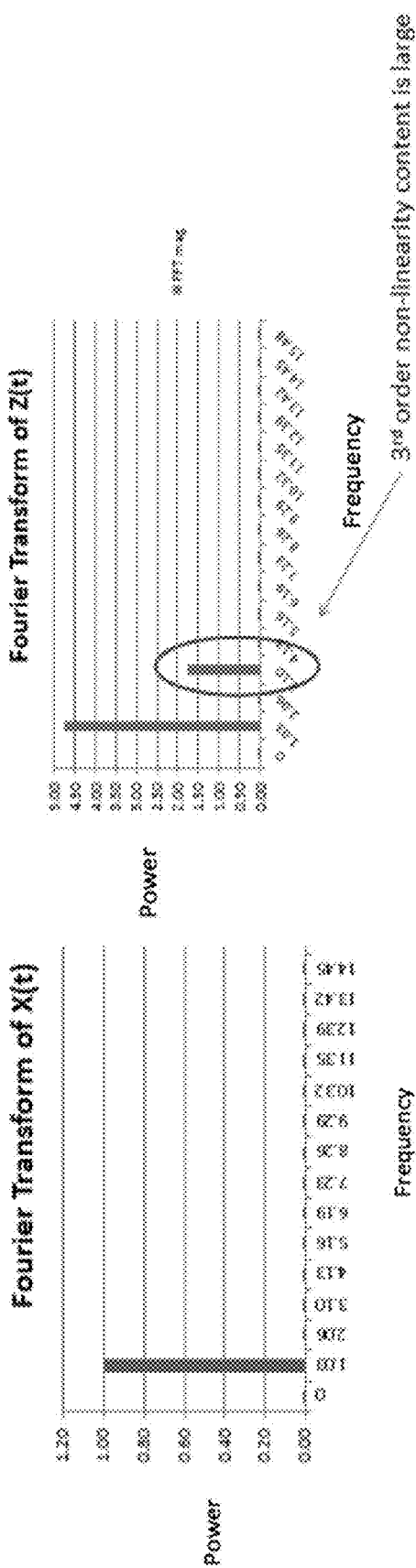
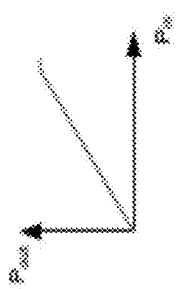
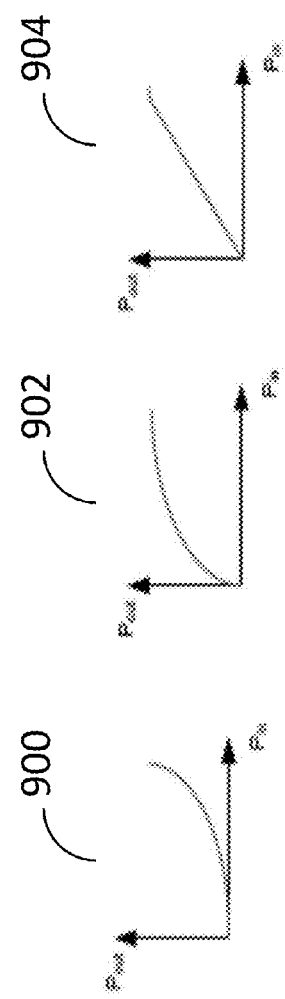
FIG. 7
FIG. 8
FIG. 9

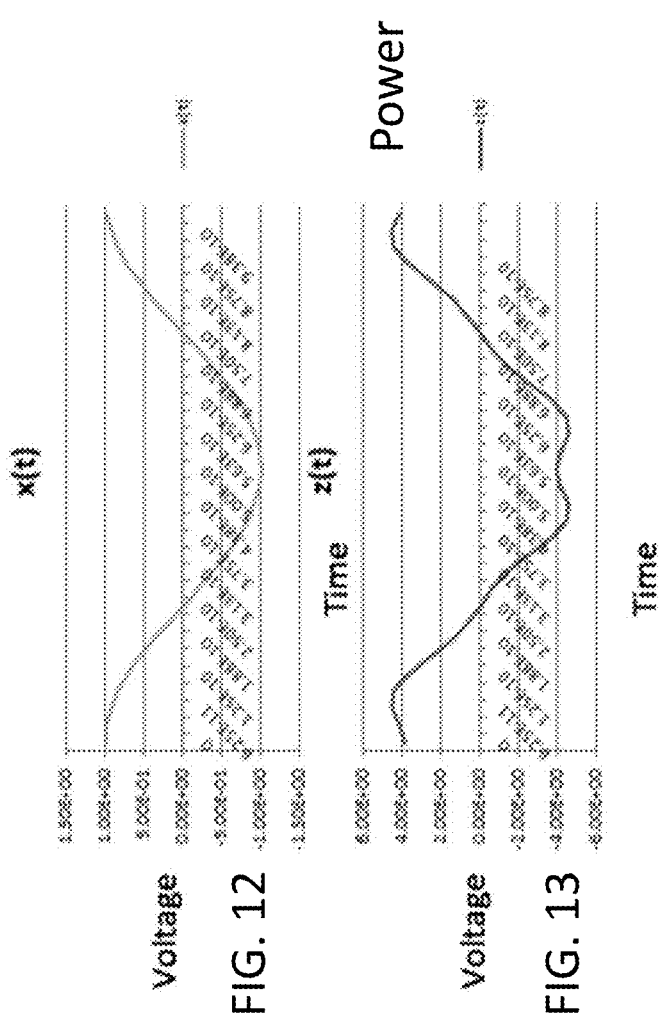

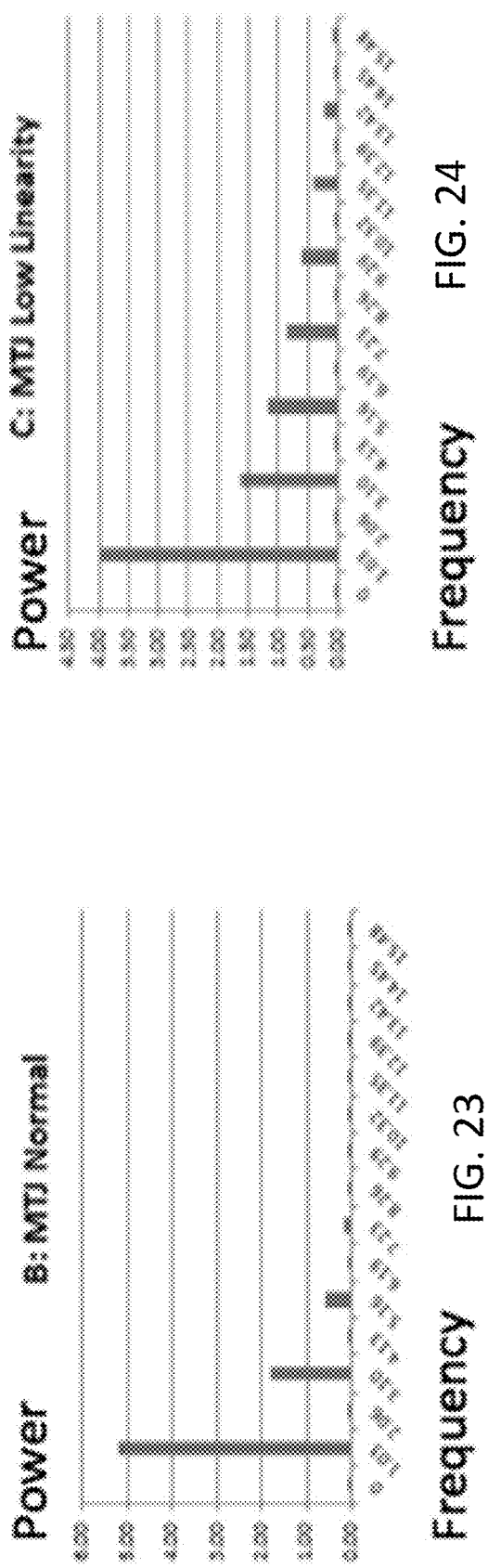

MRAM-BASED PRE-DISTORTION LINEARIZATION AND AMPLIFICATION CIRCUITS

CROSS REFERENCE TO RELATED APPLICATIONS

This application claims priority to U.S. Provisional Patent Application Ser. No. 62/162,613, filed May 15, 2015, the contents of which are incorporated herein by reference.

FIELD OF THE INVENTION

The present invention relates to power amplifiers. More particularly, the present invention relates to MRAM-based pre-distortion linearization and amplification circuit configurations.

BACKGROUND OF THE INVENTION

Highly Linear Power Amplifiers ("HLPAs") to achieve high spectral efficiency transmission systems are required in a number of contexts. For example, multimode, multicarrier wireless networks, including wideband existing and future cellular systems, including small cellular base stations and distributed antenna systems with reduced coverage areas and low transmit-power architectures all require HLPAs.

RF power amplifiers are typically non-linear. Methods to linearize the output are costly but necessary to achieve desired results. RF power amplifiers are typically operated a few dB backed off from maximum saturation power levels to maintain sufficient linearity. This back off, however, degrades the efficiency of the power amplifiers and exacerbates the thermal management of the power amplifier. These problems are not unique to RF power amplifiers. Indeed, all types of amplifiers demonstrate non-linear characteristics.

It is thus desired to minimize the amount of back-off necessary to maintain the highest efficiency and lowest power dissipation through the use of linearizers.

SUMMARY OF THE INVENTION

A circuit has a magnetic device to produce a pre-distorted signal from a sinusoidal input signal. The magnetic device has physical attributes selected to produce characteristics of the pre-distorted signal. A power amplifier is coupled to the magnetic device. The power amplifier processes the pre-distorted signal to produce an output signal with reduced nonlinear behavior associated with the power amplifier.

BRIEF DESCRIPTION OF THE FIGURES

The invention is more fully appreciated in connection with the following detailed description taken in conjunction with the accompanying drawings, in which:

FIG. 5 illustrates a typical mathematical representation of an input signal X(t) and output signal Z(t) in the time domain.
FIG. 6 depicts parameters used in accordance with disclosed embodiments of the invention.
FIG. 7 illustrates input 3 dB saturation at a peak input signal of a typical power amplifier at 1 GHz in the frequency domain.
FIG. 8 illustrates a third order non-linearity of an output signal.
FIG. 9 illustrates composite signals used to create a linear response.
FIG. 12 illustrates an input signal processed by the circuit of FIG. 10.
FIG. 13 illustrates an output signal produced by the circuit of FIG. 10.
FIG. 23 illustrates a normal frequency domain response.
FIG. 24 illustrates a low linearity frequency domain response associated with an embodiment of the invention.

Like reference numerals refer to corresponding parts throughout the several views of the drawings.

DETAILED DESCRIPTION OF THE INVENTION

Figure 1:
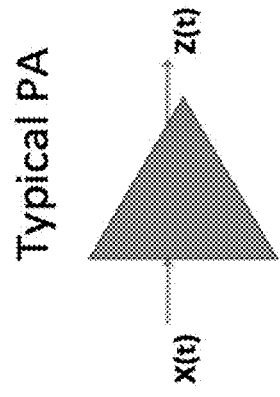
FIG. 1 is a schematic of a prior art power amplifier.

The present disclosure is directed toward an MRAM-based programmable magnetic device for pre-distortion linearization. A signal generated by a communication system typically enters the final Power Amplifier ("PA") stage producing a complex output signal that is non-linear. Embodiments of the invention utilize a pre-distortion function that "linearizes" the signal entering the PA to produce a more linear output that minimizes the non-linear components of the output signal, thereby producing a cleaner signal with minimal harmonics.

The disclosed circuits offer a compelling alternative to minimize the amount of back off necessary. The pre-distortion signal is generated with a Magnetic Tunnel Junction (MTJ)-based analog pre-distorter which typically has a smaller time correlating delay compared to a digital pre-distorter resulting in a lower cost solution. To understand the use of Magnetic Logic Unit (MLU)-PA solutions and their use of RF pre-distortion (RFPD) technology, they will be compared to the back-off methods traditionally used to improve PA linearity.

The disclosed circuits are of great interest to service providers and carriers of cellular and wireless technology. A comparable less expensive solution or improved pre-distortion solution directly translates to systems savings and improved system efficiencies. In short, less power is needed to produce the same Effective Isotropic Radiated Power ("EIRP")

Magnetic tunnel junction based MRAM cells comprise two layers of magnetic metals, such as cobalt-iron, separated by an ultrathin layer of insulator, conventionally aluminum or magnesium oxide with a thickness of about 1 nm. The insulating layer is so thin that electrons can tunnel through the barrier if a bias voltage is applied between the two metal electrodes. In magnetic tunnel junctions the tunneling current, and thus the resistance of the magnetic tunnel junction, depends on the relative orientation of magnetizations of the two ferromagnetic layers, which can be changed by an applied magnetic field.

Data can be written into an MRAM cell by changing a direction of one of the layers of magnetic metals (for example a storage layer respective to the magnetization of the other layer (for example a reference layer). The MRAM cell has a resistance value that varies depending on the magnetization direction of the storage layer. Data is read from the MRAM cell by passing a small read current, with which no magnetization switching occurs through the magnetic tunnel junction of the MRAM cell and the resistance value thereof is measured to be determined as a low resistance value or a high resistance value. The transition from High to Low resistance ("Operating Region") is highly linear, and biasing techniques ensure operation in this region.

U.S. Pat. No. 8,933,750, owned by the assignee of the present invention, discloses MLUs that may be used in accordance with embodiments of the invention. U.S. Pat. No. 8,933,750 is incorporated herein by reference.

Figure 2:
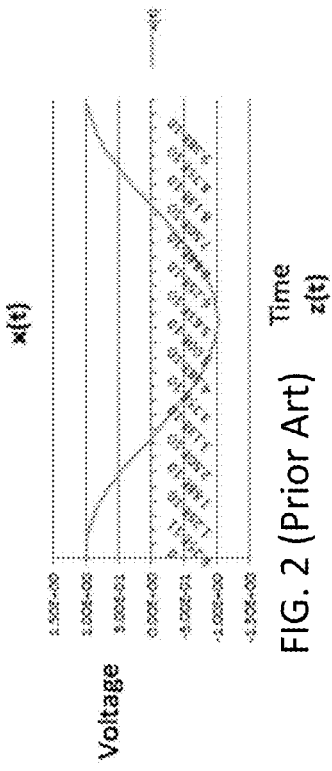
FIG. 2 illustrates an input signal processed by the power amplifier of FIG. 1.

FIG. 1 shows a typical prior art power amplifier with its input signal labeled as X(t) and its output signal as Z(t). FIG. 2 shows the plot of X(t) as an ideal sinusoidal signal (single tone 1 GHz). The disclosed techniques apply to any frequency range. In a real application, the input signal is typically a sum of multiple sinusoidal signals with varying amplitude, frequency and phase.

Figure 3:
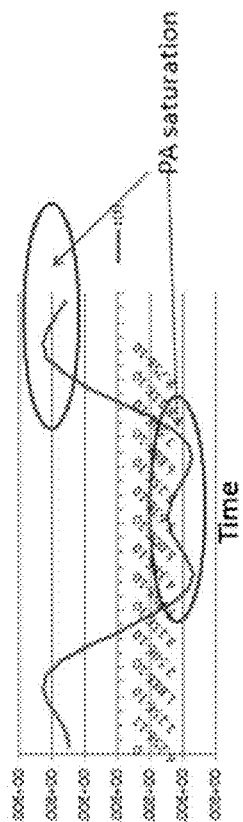
FIG. 3 illustrates an output signal produced by the power amplifier of FIG. 1.

FIG. 3 shows the plot of Z(t). Due to the nonlinearity of the power amplifier, the output signal is no longer an ideal sinusoidal signal. The Z(t) signal contains multiple sinusoidal signals with varying amplitude, frequency and phase.

Figure 4:
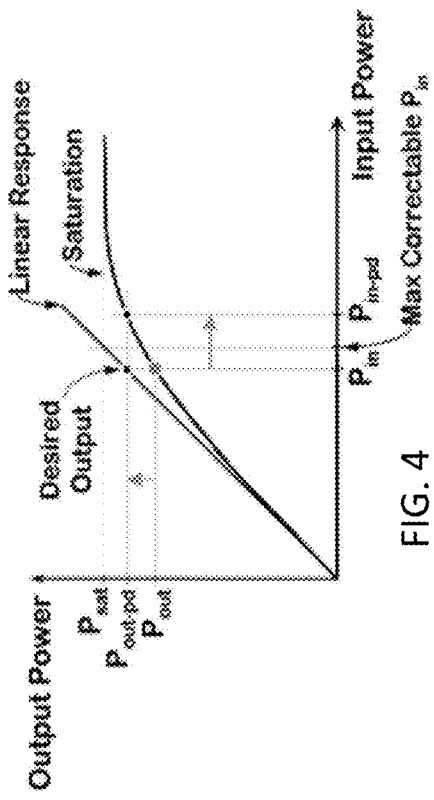
FIG. 4 illustrates a typical prior art power response for a power amplifier.

FIG. 4 shows the output power of Z(t) versus the input power of X(t). In an ideal linear PA, the relationship is a straight line. In reality, the power amplifier has a maximum output power of Psat. The power of Z(t) does not change linearly with input power when the PA is near or at saturation. The characteristics of a power amplifier near the saturation region where nonlinearities arise have a strong impact on the selection, design and effectiveness of a linearizer. A power amplifier made with an MTJ has a unique nonlinear characteristic that allows the use of an MTJ based linearizer to cancel out the nonlinearities introduced by the PA. In a broader sense, a MTJ linearizer can also be used for any given non-MTJ power amplifier by programming the parameter of the MTJ thus shaping its transfer function. The MTJ is "programmed" in the sense that its physical attributes are selected to achieve a desired signal response.

FIG. 5 illustrates a typical mathematical representation of an input signal X(t) and output signal Z(t) in the time domain. The disclosed coefficients are exemplary. They do not represent a broad characterization of a linearizer. Rather the disclosed coefficients are simply one set of coefficients out of innumerable sets of coefficients that may be used in accordance with embodiments of the invention.

FIG. 6 depicts parameters used in accordance with disclosed embodiments of the invention. More particularly, the figure illustrates coefficients used to characterize the linearizer. The figure also illustrates coefficients associated with a non-linearized response and coefficients for the response of the power amplifier.

The frequency content of X(t) and Z(t) are shown in FIGS. 7 and 8. For an ideal 1 GHz X(t) signal, there is a single spike at 1 GHz (graph shows 1.003 GHz due to the inaccuracy of Fourier transform engine). The Z(t) signal, however shows unwanted frequency content at 3 GHz in addition to the desired 1 GHz amplified signal. Note that these plots are for typical PA examples where a 3rd harmonic on intermodulation is usually the strongest unwanted signal. There may be additional spikes at 2nd, 4th, 5th, . . . harmonics.

As previously indicated, FIG. 5 shows the equations for X(t) and Z(t). For simplicity, only 3rd order components are listed. In reality one can have infinite orders. Typically, the magnitude and thus the effect of higher order signals are much less. The coefficients a1, a2, and a3 are found by fitting the transfer function between output Z(t) and input X(t).

FIG. 9 illustrates a first plot 900 of a pre-distortion signal formed in accordance with an embodiment of the invention. The second plot 902 of FIG. 9 is the signal response in the absence of the pre-distortion signal. The third plot 904 of FIG. 9 is the linear response produced by the combination of the first two signals 900 and 902.

Figure 10:
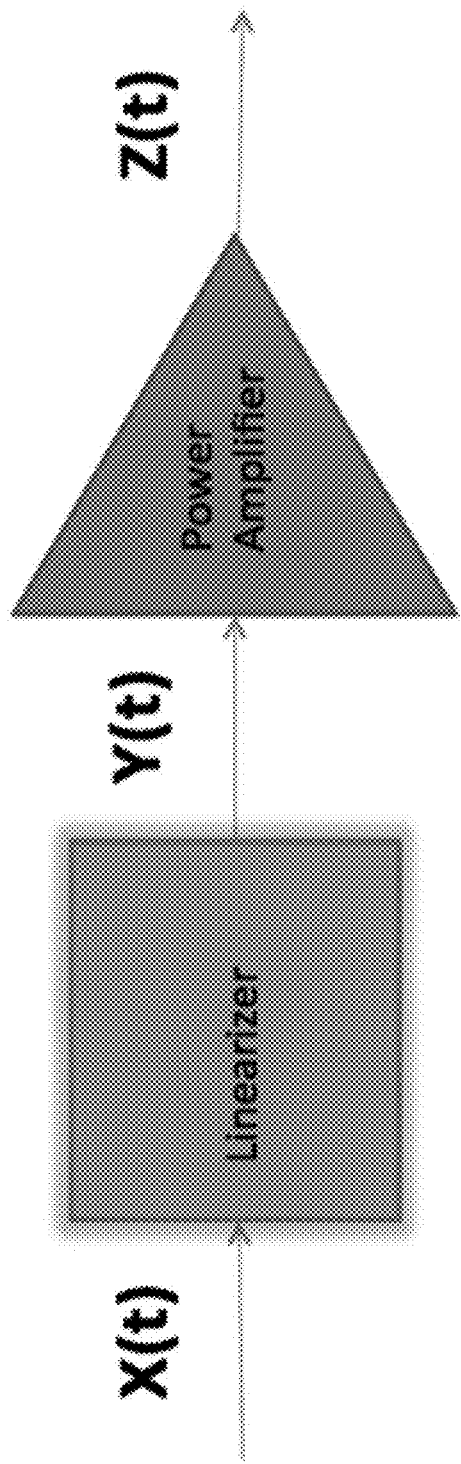
FIG. 10 illustrates a pre-distortion linearizer used in accordance with an embodiment of the invention.

FIG. 10 shows a simplified block diagram with an analog linearizer (pre-distorter) before the power amplifier of FIG. 1. The input signal X(t) enters a pre-distorter to generate a signal Y(t) before entering the power amplifier. The signal Y(t) is pre-distorted in such a way using an MTJ that its nonlinearities are canceled out by the nonlinearities of the PA, as shown in FIG. 9.

In a simplistic view, if the PA has a transfer function off (plot 902 of FIG. 9), the pre-distorter has a transfer function of 1/f (plot 900 of FIG. 9). Note that for this statement to be correct, f is the Laplace transform, i.e. working in s domain [some call Fourier domain] and not time domain).

Figure 11:
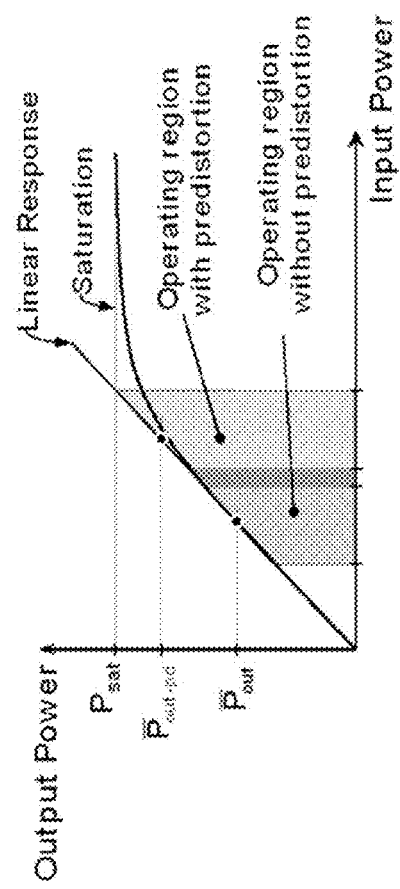
FIG. 11 illustrates an enhanced operating region achieved in accordance with embodiments of the invention.

FIG. 11 shows that a pre-distorter/Linearizer is effective near Power Saturation (Psat) area of the vertical axis. At low input power levels, far enough from Psat, the PA is linear enough that there is little need for a pre-distorter. However, at higher input power levels the linearizer provides an extended operating range.

Consider the example of FIG. 12. The coefficients a1, a2, and a3 are estimated for a typical PA and the transfer function of a linearizer is approximated by a 3rd order polynomial and its coefficients b1, b2, and b3 are listed. As mentioned before, either transfer function can be expanded to beyond 3rd order to improve accuracy (but add to complexity and cost).

FIG. 12 shows the ideal input signal, which is now applied to a linearizer. The linearizer's output Y(t) is fed to the power amplifier and FIG. 13 shows the new improved "linearized" Z(t). In particular, while FIG. 12 corresponds to FIG. 2, FIG. 13 shows an improved signal with respect to FIG. 3.

Figure 14:
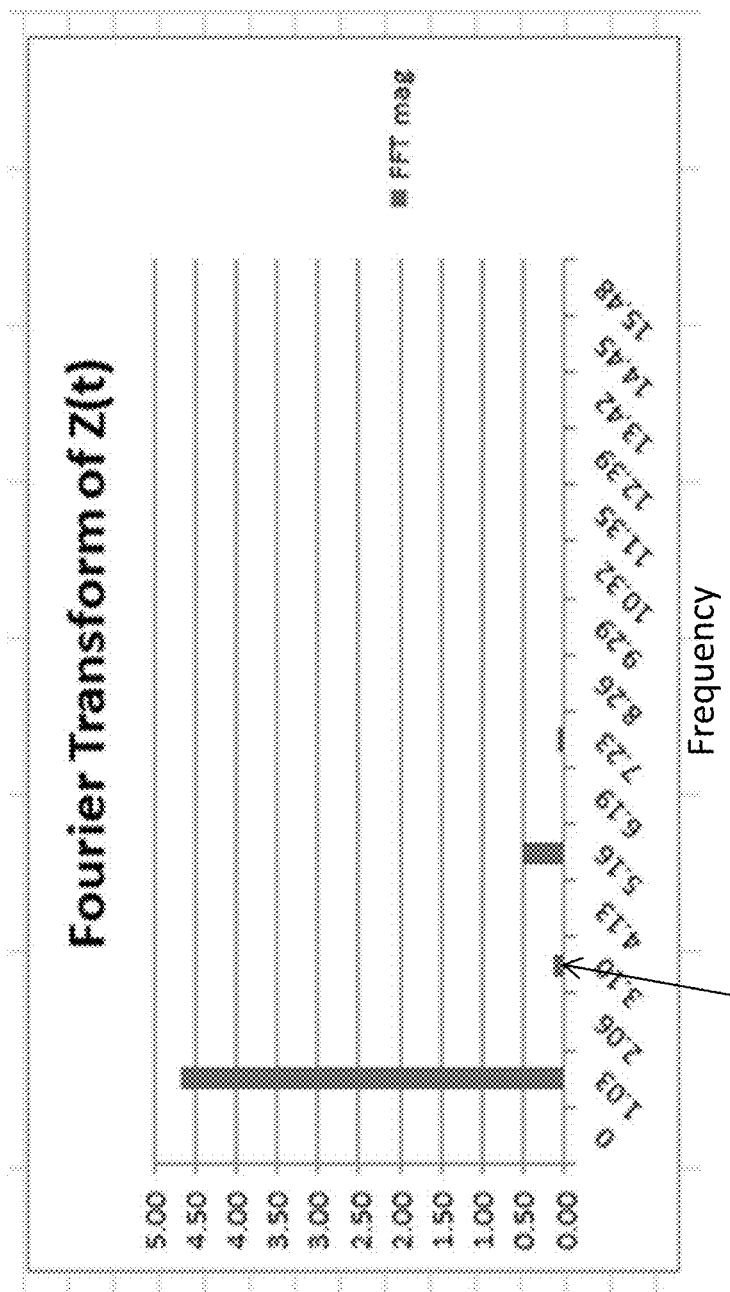
FIG. 14 illustrates a frequency domain response produced by the circuit of FIG. 10.

FIG. 14 shows the frequency content of new Z(t) in which the magnitude of the 3rd harmonic is significantly reduced. Note that in this example, the linearizer caused an unwanted 5th order harmonic. By adding more complexity to the linearizer, the 5th order can also be canceled out.

Figure 15:
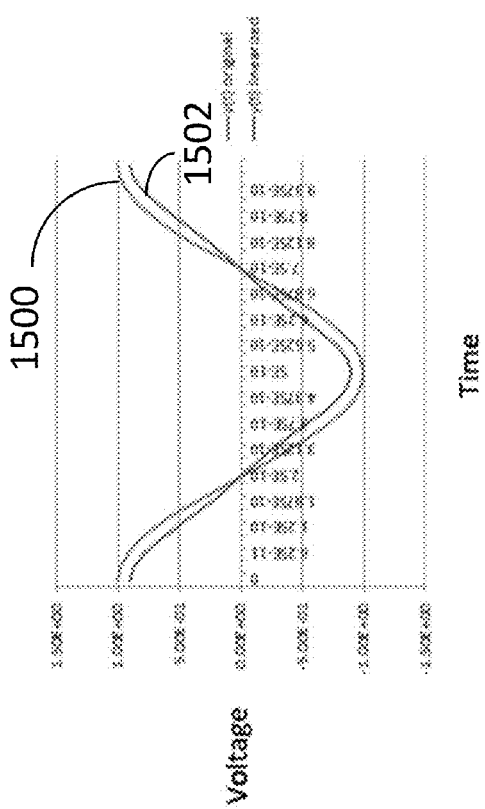
FIG. 15 illustrates an original signal and a linearized signal produced in accordance with an embodiment of the invention.

FIG. 15 shows a Y(t) signal 1500 without a linearizer (Pre-distorter) and a Y(t) signal 1502 produced using a linearizer. In this example X(t)=Y(t) when there is no linearizer, i.e. a pass through.

Figure 16:
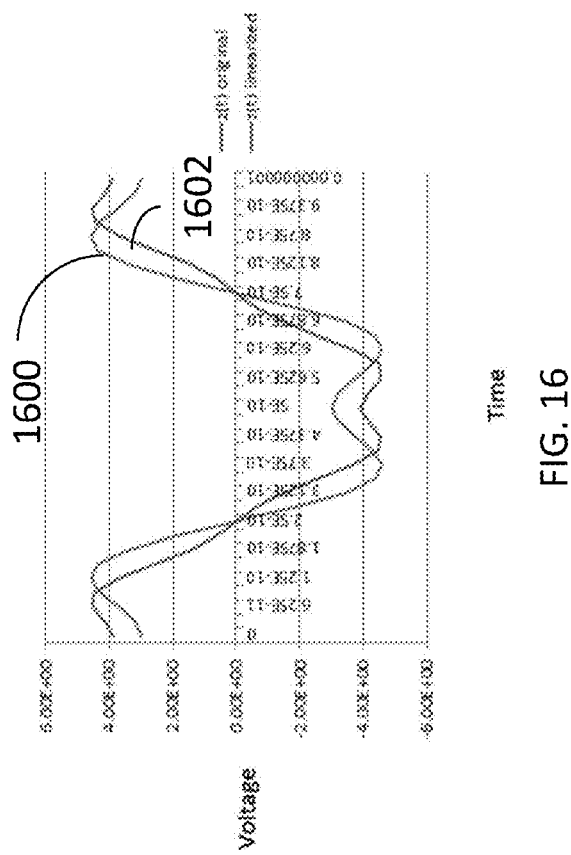
FIG. 16 illustrates an original signal and a linearized output signal produced by the circuit of FIG. 10.

FIG. 16 compares the original Z(t) signal 1600 and the linearized Z(t) signal 1602. The figure visually illustrates less degradation for the linearized Z(t) signal near the peaks of the signal (where the signal is near Psat).

Figure 17:
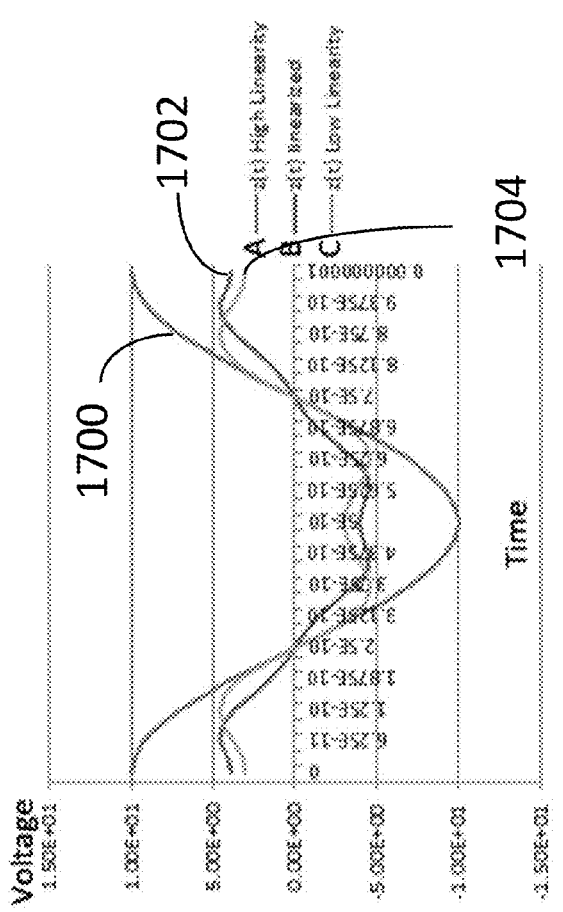
FIG. 17 illustrates different linearity signals produced in accordance with embodiments of the invention.

In FIG. 17, we compare the Z(t) for 3 extreme cases. Z(t) signal 1700 is a high linearity response. Z(t) signal 1702 is a linearized response, while Z(t) signal 1704 is a low linearity response.

Figure 18:
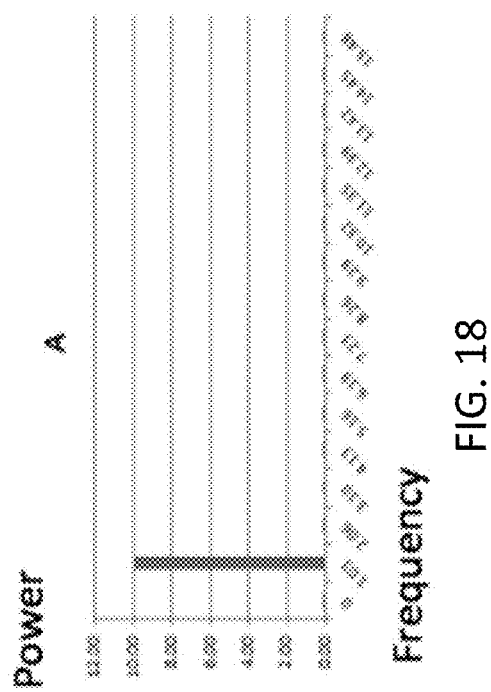
FIG. 18 illustrates a frequency domain response produced in accordance with an embodiment of the invention.

In the high linearity case "A", FIG. 18 shows a frequency domain plot where the linearizer has fully cancelled out the nonlinearity of the PA and thus Z(t) is an ideal 1 GHz signal (this is a theoretical extreme).

Figure 20:
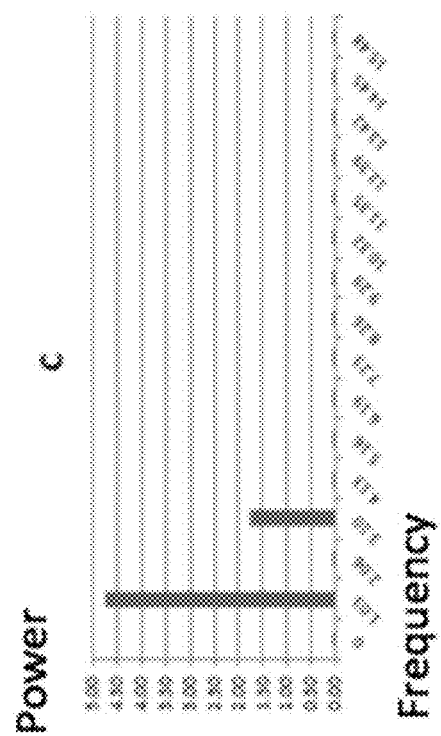
FIG. 20 illustrates a third order response associated with an embodiment of the invention.
Figure 19:
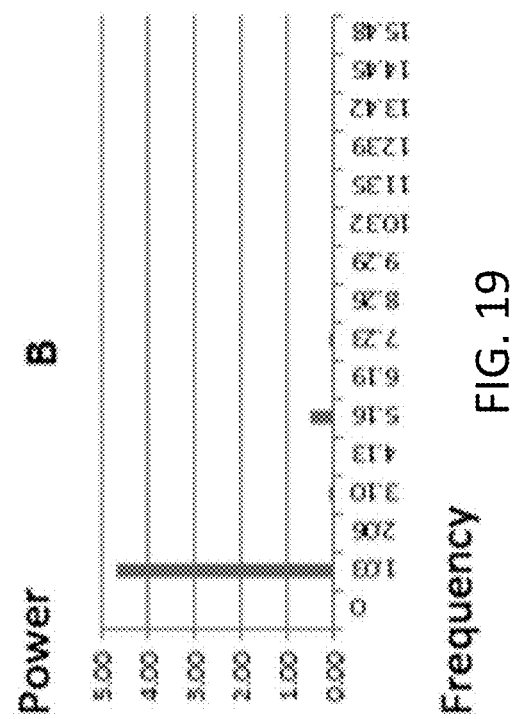
FIG. 19 illustrates a fifth order response associated with an embodiment of the invention.

In the low linearity case "C" of FIG. 20, the pre-distorter is doing little to improve the power amplifier. However, Case "B" FIG. 19 is somewhere in between and is therefore a better indication of what is achievable in a practical application.

Figure 21:
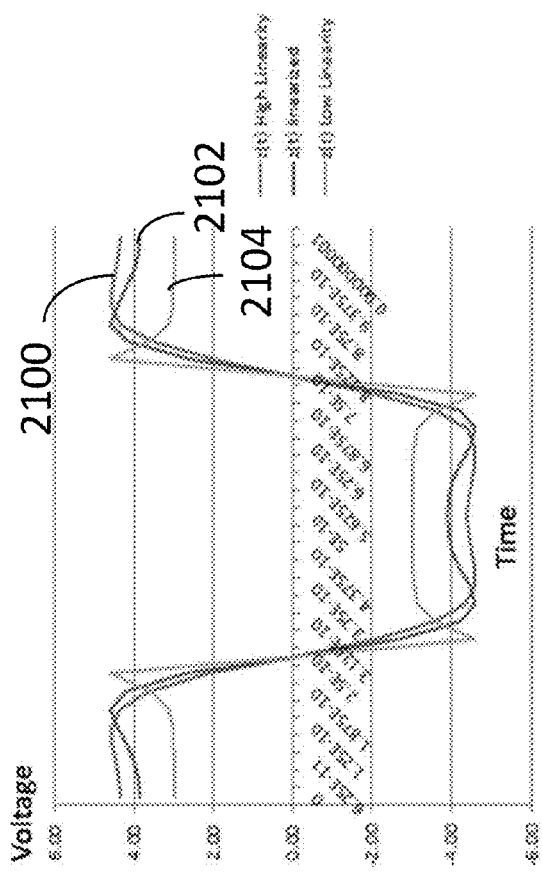
FIG. 21 illustrates different linearity signals produced in accordance with embodiments of the invention.

FIG. 21 shows Z(t) for 3 extreme cases, but this time using a MTJ as the linearizer instead of a 3rd order polynomial as shown in FIG. 17. In particular, the figure shows a highly linearized Z(t) signal 2100. Z(t) signal 2102 is a linearized response, while Z(t) signal 2104 is a low linearity response.

Figure 22:
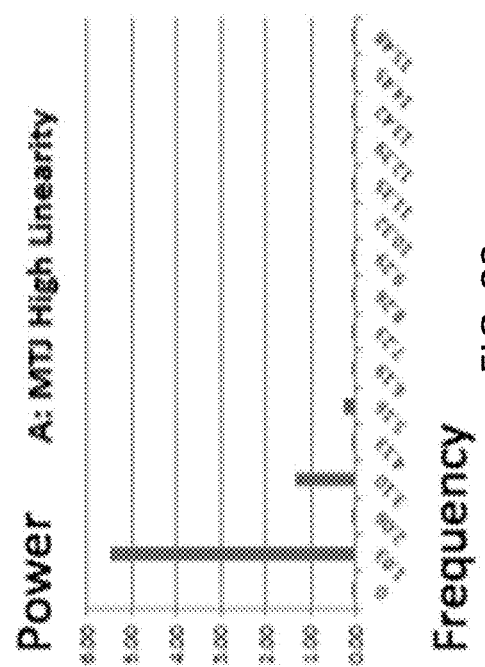
FIG. 22 illustrates a high linearity frequency domain response associated with an embodiment of the invention.

In the high linearity case "A", FIG. 22 shows a frequency domain plot in which an MTJ linearizer has cancelled out a good portion of the nonlinearity of the PA and thus there is residual content at 3rd and 5th harmonics. In the low linearity case "C" of FIG. 24, the pre-distorter is doing little to improve the power amplifier. Case "B" of FIG. 23 is somewhere in between and a better indication of what is achievable in a practical application.

In a polynomial linearizer, theoretically one can add as many coefficients "b1, b2, b3, . . . bn" to cancel out the nonlinearity of a given power amplifier. These coefficients must be calculated and implemented in a hardware format which adds to the complexity of the design and how quickly the system can respond (e.g., change in bias conditions of the PA). Trend fitting a 6th order polynomial requires precision to the 13th digit (e.g., 1013 or 244 bit digital-to-analog converter). Implementing such a system would be cost prohibitive, if even feasible. This fact underscores the significance of the disclosed MTJ pre-distortion linearizer.

Figure 25:
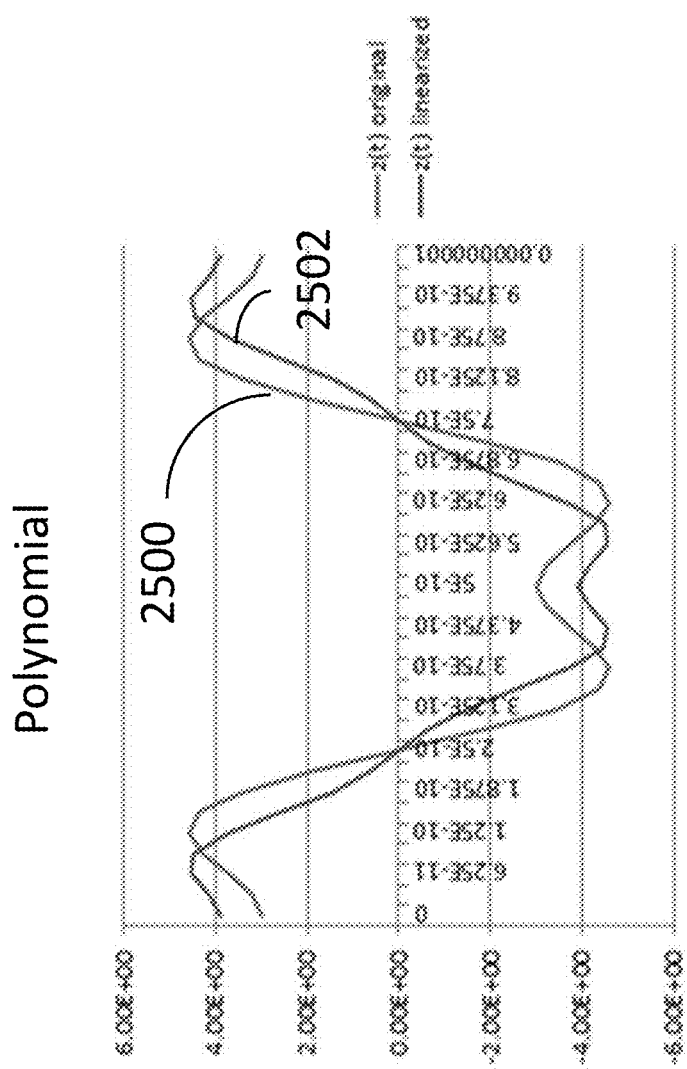
FIG. 25 illustrates a prior art polynomial linearizer response.
Figure 26:
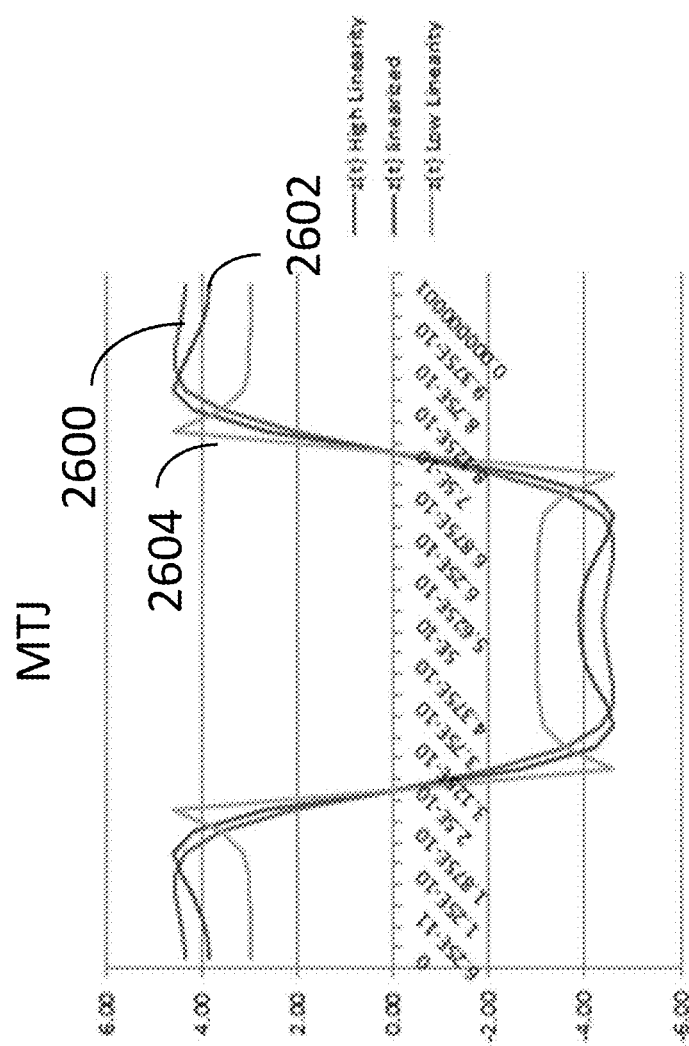
FIG. 26 illustrates different linearity signals produced in accordance with embodiments of the invention.

FIG. 25 corresponds to FIG. 16 and FIG. 26 corresponds to FIG. 21. They are put side by side to show how an MTJ linearizes a PA in contrast with a polynomial linearizer. When the PA is also MTJ-based, a linearizer based on an MTJ may have an advantage as it is implemented in the exact same process as the PA and thus its nonlinearities are similar to the PA. Therefore, in a more exotic implementation, an MTJ linearizer can cancel out a MTJ PA very effectively without the need for a large number of coefficients. Since an MTJ linearizer is an analog function, its response is very fast, i.e. its transfer function is defined by the design of the MTJ and there is no need to calculate b1, b2, b3, . . . bn coefficients.

Figure 27:
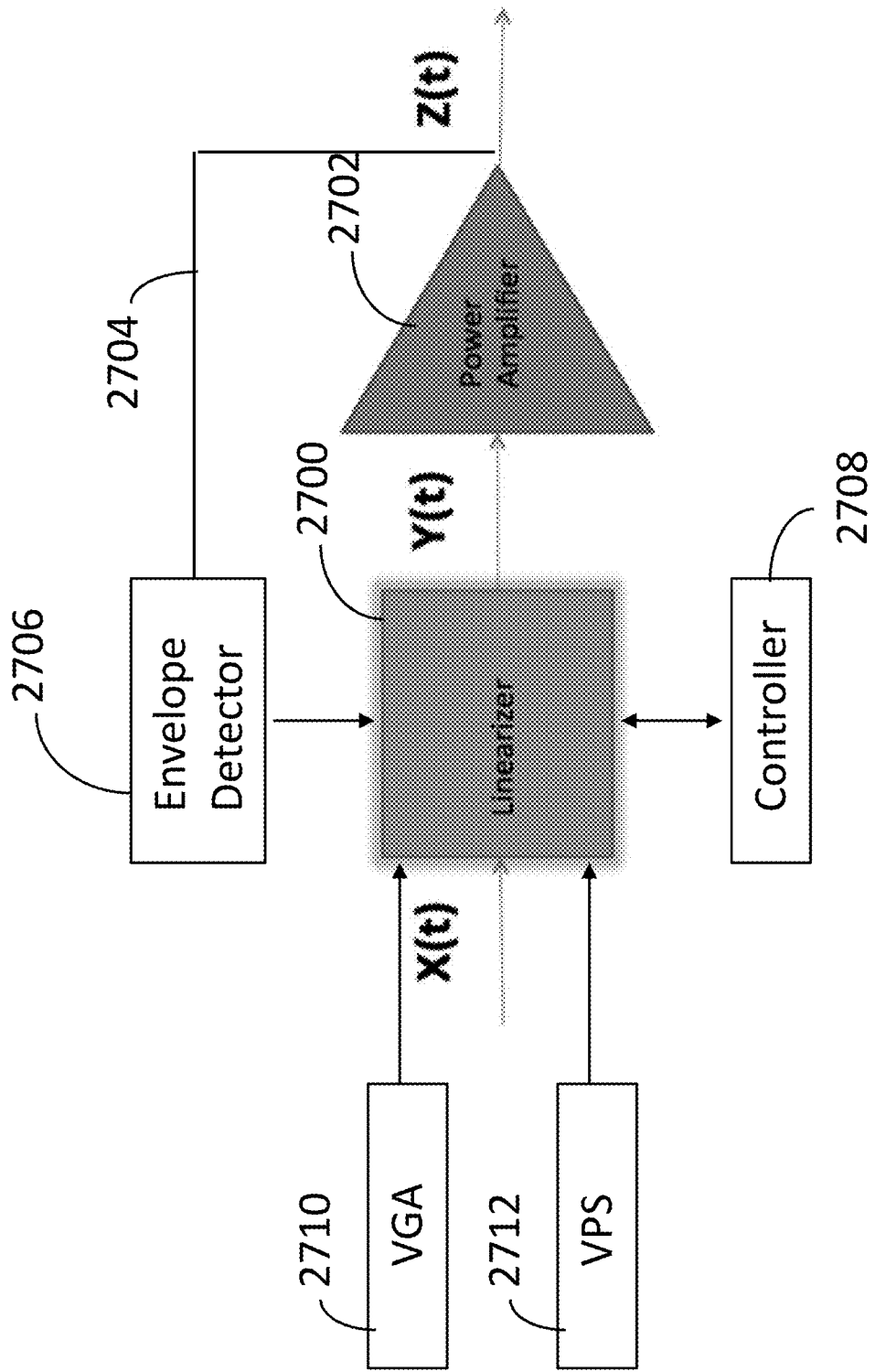
FIG. 27 illustrates various support circuits for use in connection with the disclosed linearizer.

FIG. 27 illustrates the disclosed linearizer 2700 and power amplifier 2702 with supporting circuitry. For example, a feedback loop 2704 may be used to provide feedback to linearizer 2700 and/or support circuits for the linearizer. In one embodiment, an envelope detector 2706 is connected to the feedback loop. The envelope detector detects an envelope of the output signal on the feedback path 2704. The envelope is used to bias the linearizer 2700 such that the linearizer 2700 generates a pre-distortion signal based on the envelope. Alternately or in addition, a controller 2708 may be used to adjust the bias of the linearizer 2700. In particular, the bias is adjusted to provide a desired pre-distorted signal.

In another embodiment, one or more variable gain amplifiers 2710 are used to alter attributes of the pre-distorted signal. In another embodiment, one or more variable phase shifters 2712 are used to alter attributes of the pre-distorted signal. On or more of support circuits 2704 through 2712 may be used in different combinations in accordance with various embodiments of the invention.

Figure 28:
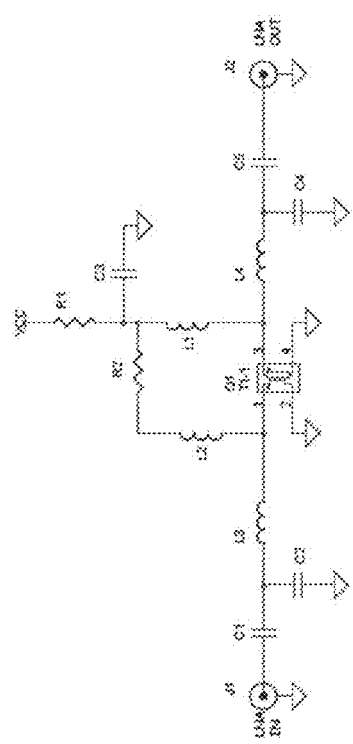
FIG. 28 illustrates a narrow band tuned low noise amplifier that may be used with the disclosed linearizer.
Figure 29:
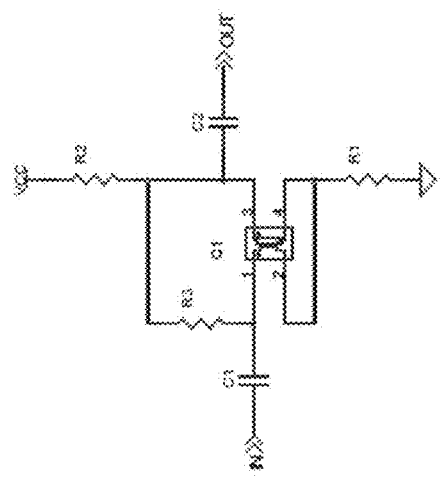
FIG. 29 illustrates a magnetic logic unit inverting amplifier that may be used with the disclosed linearizer.
Figure 30:
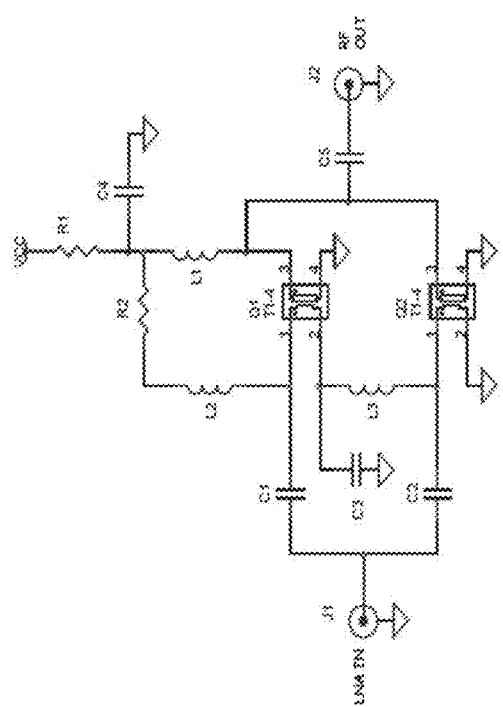
FIG. 30 illustrates a broadband, high-dynamic range low noise amplifier that may be used with the disclosed linearizer.

FIG. 28 illustrates a narrow band tuned low noise amplifier that may be used with the disclosed linearizer. FIG. 29 illustrates a magnetic logic unit inverting amplifier that may be used with the disclosed linearizer. FIG. 30 illustrates a broadband, high-dynamic range low noise amplifier that may be used with the disclosed linearizer.

In sum, disclosed herein is an MTJ used as a linearizer. Those skilled in the art will appreciate that there are many circuit topologies with varying degrees of pros and cons that may be used in accordance with embodiments of the invention.

The foregoing description, for purposes of explanation, used specific nomenclature to provide a thorough understanding of the invention. However, it will be apparent to one skilled in the art that specific details are not required in order to practice the invention. Thus, the foregoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications, they thereby enable others skilled in the art to best utilize the invention and various embodiments with various modifications as are suited to the particular use contemplated. It is intended that the following claims and their equivalents define the scope of the invention.

The invention claimed is:
1. A circuit, comprising:
a magnetic device to produce a pre-distorted signal from a sinusoidal input signal, wherein the magnetic device has physical attributes selected to produce characteristics of the pre-distorted signal, wherein the magnetic device includes an array of magnetic tunnel junctions, each magnetic tunnel junction comprising a reference layer having a reference magnetization, a tunnel barrier layer, and a storage layer having a storage magnetization; and
a power amplifier coupled to the magnetic device, the power amplifier processing the pre-distorted signal to produce an output signal with reduced nonlinear behavior associated with the power amplifier.

2. The circuit of claim 1 wherein the sinusoidal input signal is a radio frequency signal.

3. The circuit of claim 2 wherein the radio frequency signal is a modulated signal.

4. The circuit of claim 1 wherein the array of magnetic tunnel junctions is biased in the linear operating domain.

5. The circuit of claim 1 wherein at least one of the reference layer, the tunnel barrier layer and the storage layer has physical attributes selected to produce characteristics of the pre-distorted signal.

6. The circuit of claim 1 wherein the physical attributes are selected to compensate for third order and higher order intermodulation distortion products of the sinusoidal signal.

7. The circuit of claim 1 wherein the power amplifier is a magnetic device.

8. The circuit of claim 1 further comprising a controller for adjusting the bias of the magnetic device and thereby adjust the pre-distorted signal.

9. The circuit of claim 1 further comprising a feedback loop between the power amplifier and the magnetic device to dynamically adjust the pre-distorted signal.

10. The circuit of claim 9 wherein the feedback loop includes an envelope detector for detecting an envelope of the output signal, and wherein the magnetic device generates the pre-distortion signal based on the envelope.

\* \* \* \* \*